(12) United States Patent
Park (10) Patent No.: US 6,767,439 B2
(45) Date of Patent: Jul. 27, 2004

(54) HIGH THROUGHPUT THIN FILM DEPOSITION AND SUBSTRATE HANDLING METHOD AND APPARATUS FOR OPTICAL DISK PROCESSING

(76) Inventor: Young Park, 3157 Louis Rd., Palo Alto, CA (US) 94303

( * ) Notice: Subject to any disclaimer, the term of this patent is extended or adjusted under 35 U.S.C. 154(b) by 215 days.

(21) Appl. No.: 10/045,849

(22) Filed: Nov. 7, 2001

(65) Prior Publication Data

US 2003/0106791 A1 Jun. 12, 2003

Related U.S. Application Data

(63) Continuation of application No. 09/542,799, filed on Apr. 4, 2000, now abandoned.
(60) Provisional application No. 60/144,602, filed on Jul. 19, 1999.

(51) Int. Cl.$^7$ .................. C23C 14/34; C23C 14/35; C23C 16/00
(52) U.S. Cl. .............. 204/298.25; 204/298.23; 204/298.35; 118/719; 118/729; 156/345.31; 156/345.54
(58) Field of Search ............... 204/192.12, 298.23, 204/298.24, 298.25, 298.15, 298.35; 118/718, 719, 729; 427/255.5; 156/345.31, 345.54

(56) References Cited

U.S. PATENT DOCUMENTS 4,437,966 A * 3/1984 Hope et al. ............ 204/192.12
4,952,295 A * 8/1990 Kawabata et al. ..... 204/192.15
5,879,519 A * 3/1999 Seeser et al. .......... 204/298.26
5,958,155 A * 9/1999 Kawamata et al. ......... 148/420
6,068,878 A * 5/2000 Alwan ........................ 427/77

OTHER PUBLICATIONS

Thin Film Processes, Vossen et al. pp. 151, 1978.*

* cited by examiner

Primary Examiner—Rodney G. McDonald
(74) Attorney, Agent, or Firm—Shirley L. Church (57) ABSTRACT

The disclosure herein relates to a high throughput system for thin film deposition on substrates which can be used in applications such as optical disks, and in particular DVD disks, chip-scale packaging, and plastic based display, for example. An apparatus useful in the production of products of the kind described above includes: (a) a continuously moving web for simultaneously transporting a number of substrates to which a thin film of material is to be applied, wherein the moving web is a roll-to-roll moving web; (b) a central processing chamber which is maintained under vacuum and through which at least a portion of said continuously moving web travels; and, (c) at least one deposition device which is located within said central processing chamber, where at least a portion of said continuously moving web is exposed to material deposited from said deposition device. Typically the deposition device is a magnetron sputtering device. In addition, the apparatus typically also includes (d) a first moving platform which transfers a substrate onto said continuously moving web, and (e) a second moving platform which receives processed substrates from said continuously moving web.

15 Claims, 3 Drawing Sheets

HIGH THROUGHPUT THIN FILM DEPOSITION AND SUBSTRATE HANDLING METHOD AND APPARATUS FOR OPTICAL DISK PROCESSING

This application is a continuation application of application Ser. No. 09/542,799, filed Apr. 4, 2000, now ABN, which claims priority of U.S. Provisional Application No. 60/144,602, filed Jul. 19, 1999.

BACKGROUND OF THE INVENTION

1. Field of the Invention

The present invention relates to a method and apparatus for high throughput thin film deposition upon and substrate handling of optical disk substrates. In particular, multi-layer thin films are deposited on substrates which are subsequently finished for use in optical disk applications such as DVD (digital versatile disk). To obtain increased processing efficiencies, the deposition apparatus includes a moving web which holds substrates in position as they are carried from one processing location to another.

2. Brief Description of Background Art

Throughput or processing rate (number of substrates processed per hour) directly impacts on the cost of manufacturing the optical disks. Due to the nature of the process steps used to produce an optical disk, and particularly thin film deposition where vacuum maintenance requirements and cleanliness (avoidance of substrate contamination by particulates) is critical in ensuring film quality, the optical disk industry has struggled with system-related throughput problems.

One of the more popular methods of optical disk production used to improve throughput is the cluster tool. The cluster tool is a multi-chamber tool sharing a common substrate handler. From a cost perspective, multiple chambers running the same process in parallel and sharing a common substrate handler can provide throughput which is superior to an equivalent number of stand-alone single substrate tools or to an in-line system (which will be described subsequently herein). A multi-chamber tool uses floor space and processing time more efficiently than a number of stand-alone single substrate tools. The substrate handler also has much less idle time than if it were only servicing one chamber. While one chamber is busy, the handler can still transfer wafers to or from other pods of the multi-chamber system.

Additional economic benefits accrue when a series of processes that could be performed separately are linked in one tool. The reduced substrate handling and decreased numbers of pump-and-vent cycles decrease foreign material, especially in vacuum-equipped clusters used for plasma processing. Eliminating substrate transfer from tool to tool reduces the substrate processing time through the cluster and decreases the cycle time and lot turn-around time. When substrates are processed in a continuous manner, delay times between sequential steps can be more tightly controlled. Clusters that keep substrates under vacuum during diverse sequential process steps allow new processing options since surface interactions with atmosphere and moisture are avoided. Multiple repetitive steps are also more attractive. Despite these advantages, the types and capabilities of the component process modules/chambers and substrate transfer capabilities limit the flexibility of the cluster tools on the market. One of the most significant detractors to cluster processing is mean time-to-failure (MTTF); this must be addressed with high priority, especially since an entire cluster is incapacitated when a single module fails.

The overall control of the multi-layer processing may be the most difficult aspect of the cluster system. Due to an intrinsic nature of substrate routing sequence in a cluster tool system, the presently available software limits the maximum throughput. The most popular cluster tool's throughput is limited to about 72 substrates per hour for a single-layer deposition. When three different layers must be processes, the presently available throughput is 36 to 40 substrates per hour in a 3-chamber/module system.

The production system most commonly used in the industry employs an in-line batch system for the thin film deposition process. In in-line batch systems, the substrates are loaded onto a substrate holder or pallet. In a batch sputter-down system, the substrates may only be placed on a holder. Under this configuration, there are defects generated from the sputter target and shield areas, which affect on film quality and consequently product yield. Use of pallets also increases the particle occurrence and overall cost of ownership (COO) from maintenance and spare stocks.

An in-line batch system may be able to handle up to about 100 substrates per hour for a single layer film deposition; however, because of batch-nature of the substrate loading, there is a penalty for throughput loss from engineering reliability such as loading and unloading steps. In addition, there is a build up of particulates on the moving carrier used to move the substrates through the deposition processing area. For example, a moving belt which repeatedly circles within the process area, handling a series of substrates, accumulates particulates and requires a cleaning process for particulate removal, leading to high maintenance downtime. In addition to maintenance downtime, particulates which accumulate on the belt may contaminate substrates which contact the belt. Belt hardening occurs over time, requiring belt replacement. When a more complicated product is produced, such as one which requires a three layer film deposition, the slowest deposition process dictates the overall throughput rate for the system, since such systems are not equipped with flexible hardware of the kind which will be described with reference to applicant's invention. In addition, presently known in-line batch systems frequently experience cross-contamination when more than one film material is deposited, due to lack of proper isolation shields between material deposition areas.

Web deposition systems have long been used in the preparation of coated substrates such as metallized films. As its name implies, web deposition or coating involves the vacuum deposition of thin films onto flexible substrates such as films which act as moving webs. The substrate is unrolled from a feed reel at the beginning of the web, the deposition is made on the substrate surface, and then the substrate is rolled back up again on a take up reel. The deposition rate and the film thickness required limit the speed at which the substrate travels past a deposition station. Web coaters often contain several deposition stations that coat the substrate sequentially as it moves past them.

Vacuum web coating is the expansion of vacuum coating to large-surface, web-shaped substrates. The substrate is coated in a partial vacuum as the substrate passes by the deposition source along the path between the feed reel and the take up reel. An interesting history of web coating is provided in an article by E. O. Dietrich et al., entitled "Vacuum Web Coating—An Old Technology With A High Potential For The Future", Society of Vacuum Coaters, 40th Annual Technical Conference Proceedings, pp. 354–364 (1997). These systems involve the application of coatings to a substrate which is moved past the coating source in the form of a continuous web which is unwound from one roll and rewound upon another roll.

In addition to sputter or evaporated coatings, plasma assisted chemical vapor deposition films have been deposited upon moving web substrates. Web coaters may contain several deposition stations that coat the substrate sequentially as it moves past them. Some of the more significant problem areas include the release of water vapor from the substrate during web coating; buckling or tensioning along the longitudinal edges of the web; transverse warping of the web of substrate material; and the presence of particulate contaminants. Transverse warping of the web is caused by the force of gravity acting upon the web, the elongated path of travel which the web of substrate material follows, stresses from external sources developed upon the web of substrate material, the high deposition temperatures to which the web of substrate material is continuously subjected, and the forces created by the highly stressed semiconductor alloy material deposited upon the web of substrate material. U.S. Pat. No. 4,664,951 to Joachim Doehler, issued May 12, 1987 describes a method of providing for corrective lateral movement of a web of substrate material which is adapted to continuously move in a longitudinal direction through a vapor deposition processor.

In an article entitled "Erasable Phase-Change Optical Materials, MRS Bulletin, September 1996, pp. 48–50, Noboru Yamada describes various materials of the kind which can be used to form an erasable optical disk. The erasability is based on optical memory materials which undergo phase changes affecting optical transmission. In practical systems, a laser beam focused into a diffraction-limited spot is used for recording. This enables the spacial size of one bit of data to be very small (of submicron order) so that the recording density is very high. Amorphous recording marks are formed in crystallized areas along tracks. The mark size is about 0.5 $\mu$m. The phase-change optical-memory materials must have proper optical constants; an absorption edge that shifts in the visible or near-infrared wavelength region with phase transitions; a suitable melting point—the materials must be able to be melted with an available laser power, but must not melt at such a low temperature that self-crystallization occurs; and, there must be a rapid and stable phase-transition process. The number of materials meeting this requirement are limited.

The Yamada article describes an example erasable optical disk sample where the substrate is PMMA (polymethyl methacrylate) having deposited on its surface three layers. A first layer of ZnS (dielectric undercoat) a second GE—Sb—Te active layer, and an undefined overcoating layer. After deposition of the three layers on the PMMA substrate, an overlying PMMA substrate layer is applied using a photo-polymer adhesive. The Yamada article does not describe the apparatus used to fabricate the erasable optical disk; however, it is readily apparent to one skilled in the art that stresses introduced into the depositing materials are likely to have an effect on crystallization and phase-transition processes. With this in mind, it would be highly desirable to have a high throughput apparatus which does not introduce stress into the substrate material or into the thin films being deposited on that material.

SUMMARY OF THE INVENTION

In accordance with the present invention, an apparatus and method are described which provide high volume, high throughput deposition of thin films on substrates useful in electronic applications such as optical disks, chip-scale packaging, and plastic based display, by way of example, and not by way of limitation.

An apparatus commonly includes: (a) a continuously moving web for simultaneously transporting a number of substrates to which a thin film of material is to be applied, wherein said moving web is commonly a roll-to-roll moving web; (b) a central processing chamber which is maintained under vacuum and through which at least a portion of said continuously moving web travels; and, (c) at least one deposition device which is located within said central processing chamber, where at least a portion of said continuously moving web is exposed to material deposited from said deposition device. Typically the apparatus also includes: (d) a first moving platform which transfers a substrate onto said continuously moving web; and (e) a second moving platform which receives processed substrates from said continuously moving web.

In one method of depositing at least one thin film on a substrate useful in electronic applications, comprises the steps of: placing a series of substrates onto a continuously moving disposable web; exposing a surface of the moving disposable web on which the substrates are setting to at least one depositing material, to form at least one layer of material on a substrate; and, unloading the substrate from the continuously moving disposable web. Typically the depositing material is sputter deposited. Preferably, sputtering is carried out using a planar magnetron, and wherein the RF power applied to a sputtering target is about 100 to about 5,000 W at a frequency of about 10 to about 30 MHZ. Typically the pressure at the surface of the substrate during deposition of a material is a vacuum of about $10^{-5}$ torr ($1.3 \times 10^{-3}$ Pa) or an increased vacuum, whether material deposition is by sputtering or another technique. The preferred moving disposable web is a roll-to-roll web, and the roll speed of the web is based on a required film thickness of a depositing material layer which has a narrow processing window. Substrates are held in place on the moving disposable web by friction or electrostatic attraction.

When only one thin film layer is to be deposited on the substrate, one deposition device is typically adequate, depending on the thickness of the film to be deposited. When multiple overlying thin film layers are to be produced, generally the number of layers determines the number of deposition devices. Preferably the at least one deposition device provides for sputtering or reactive sputtering of material to produce a thin film layer on the substrate, although evaporation and chemical vapor deposition and other coating deposition techniques may be used as well. Typically, in the production of optical disks, the number of deposited thin film layers of different materials is in the range of 4 or fewer. When the thin film layers are deposited using sputtering techniques, this may require the use of up to four different sputtering targets. The target may be attached to or may be the cathode of the sputtering device.

To simplify operational requirements, the power to a sputtering device cathode is independently on without interruption, enabling a continuous operation until shutdown is required for purposes of repairing or replacing the continuously moving web. A preferred method for moving the web is continuous transfer of a web material from one roll to another; a roll-to-roll moving web. Rolls of material used to supply the web may be spliced together to permit continuous operation of the web. For purposes of simplification and reliability, the preferred power to the cathode targets for sputtering is by radio frequency (RF) for both ceramic and metal target materials.

An advantageous sputtering source for each cathode is a planar magnetron. The use of a rectangular (rather than circular) shaped sputtering target in combination with the sputtering source enables the deposition of a high quality film at reduced target cost. For example, a sputtering target about 120 mm wide by 300 mm long is adequate when two optical disks transverse the continuously moving web and travel side-by-side along the longitudinal distance of travel on the web. A wider web, permitting processing on an increased number of optical disks positioned transversely across the width of the web would require a wider sputtering target or more than one target adjacent to each other and in a transverse direction relative to the moving web. A sputtering target may be angled to the substrate plane to provide improved step coverage. Preferably, the angle is less than 20 degrees from horizontal to the plane of the continuously moving web; typically the angle is about 10 degrees. An optimum deposition rate may be obtained by changing the distance between the sputtering target surface and the substrate and by changing the power to the sputtering target, or by using a combination of these techniques.

When more than one sputtering target is used (in a longitudinal direction relative to the moving web), so that different coating materials may be applied in overlying layers, a shield between neighboring sputtering targets is typically required to isolate RF interference between neighboring targets (cathodes). A shield also function as a barrier to cross-contamination between deposition areas for different materials. In one embodiment, the shield is "T" shaped, with the arms of the T at the base of the shield, near the substrate surface, so the arms catch falling debris and prevent the debris from contaminating the substrate as it passes by.

Preferably, the first moving platform for loading the substrates onto the moving web (the loading platform) is positioned adjacent the moving web and within the central processing chamber. Or, the first moving platform may reside in a loading chamber (loading plenum chamber) which leads to the central processing chamber. One skilled in the art can envision a number of different possibilities for loading the substrates onto a moving web which carries them by various deposition stations. The loading platform includes apparatus elements, preferably a table supporting a moving belt, which can be made to move in an x-direction or in a y-direction, where x-represents the longitudinal direction of the moving web which carries the substrates and y-represents the transverse direction to the moving web. The x- and y-directional movements enable an incoming substrate to be rotated and translated for positioning on the moving web. Optionally, the first moving platform may include a hand-off pusher which engages the substrate with the moving web.

Preferably, the second moving platform, which is used for moving the substrates off the moving web (the unloading platform) is also located within the central processing chamber, for purposes of minimizing cross contamination during unloading of the substrates. Or, the unloading platform may be located in an unloading chamber (unloading plenum chamber) which leads away from the central processing chamber. Preferably, the second moving platform is also capable of performing x- and y-directional movements (similar to one for loading in the entrance), for purposes of dis-engaging substrates from the continuously moving web. Optionally, a push or kick device may be used to clear substrates from the moving web and make clear the path for exiting substrates arriving at the unloading platform.

The first and second moving platforms may be timed or set to provide x- and y- directional motions which correspond with the speed of the moving web. A position sensor may be placed in the area of the second moving platform so that substrate positions can be adjusted relative to a storage container which is used to collect the substrates as they exit the central chamber or the unloading plenum chamber. central processing chamber which is maintained under vacuum by a dedicated high vacuum system, permits application of a base vacuum of at least $10^{-6}$ torr ($1.3 \times 10^{-4}$ Pa). The central processing chamber is not exposed to air under normal deposition and substrate loading and unloading steps and is typically operated at a vacuum of at least $10^{-4}$ torr ($1.3 \times 10^{-2}$ Pa).

Typically a plenum chamber (loading plenum chamber) is used Co bridge between a load-lock area in which substrates entering the processing system are placed and the central processing chamber. Another plenum chamber (unloading plenum chamber) is used to bridge between the central processing chamber and a load-lock area for unloading processed substrates. The plenum chambers are under a moderate vacuum which is commonly in the range of about $10^{-4}$ torr ($1.3 \times 10^{-2}$ Pa), which is pumped down by a second dedicated vacuum pump. Substrates are continuously transferred via vacuum isolation valves which operate between the load-lock areas and the plenum chambers and between the plenum chambers and the central processing chamber. The vacuum isolation valves repeatedly open and close as substrates are passing into and out of each chamber. Process system control software maintains the relative positioning of opening and closing valves so that the isolation valve between a load-lock area and a plenum chamber is not open at the same time as the isolation valve between the plenum chamber and the central processing chamber, to prevent exposure of the central processing chamber to an adverse vacuum condition or "vacuum back".

Preferably the continuously moving web is made of a polymeric material; and, a preferred polymeric material, not by way of limitation is PET (polyethylene terephthalate).

Typically, the apparatus also includes a cooling device which permits the cooling of the continuously moving web and substrate if necessary. A variety of different cooling methods are applicable. A particularly useful cooling device is a cooling channel is embedded inside a roll drum. A roll drum refers to the very slight curvature of the web surface in the longitudinal direction between the web feed roll and the web take-off roll, to provide for proper web tension and movement control. The speed of the web is preferably determined by the speed of the take-off roll.

Process variable control is implemented using a computerized control system which is programmed to account for factors such as web speed; speed of the loading platform; speed of the unloading platform; loading and unloading cassette elevator speed; power applied to a sputtering target and adjustment of the sputtering process or reactive sputtering process, to provide for balanced and optimal thickness depositions for a particular product; pump speed of a vacuum pump used to create vacuum within a process chamber; power to a heating source or cooling source; traveling web replacement; system maintenance such as shield cleaning; and/or similar process variables. The programming of the control system provides coordination between at least a portion of the process variables, such as synchronization of isolation (slit) valves with the web speed and a substrate position.

DETAILED DESCRIPTION OF THE INVENTION

The present disclosure pertains to a high throughput system for deposition of thin films on substrates for use in optical disk and other applications. Applications for the product of the method include DVD disks, chip-scale packaging, and plastic based display, for example, and not by way of limitation. Use of a continuously moving web which transports optical disk substrates within the thin film deposition area is a key to the high throughput. The mechanisms for loading and unloading the substrates are designed for increased throughput.

Since the weight of the substrate is negligible, there is no weight related issue such as sagging or slipping, when a roll-to-roll web is used as a substrate carrier. This is particularly true since the temperature of the moving carrier web typically does not rise above 100° C., and could be cooled to maintain structural stability if necessary. The system of the present invention does not have the problem that stress is induced into the product due to stresses which occur in the web, since the product is merely carried by the web and is not part of the web. Typically the substrate is held in position on the web by friction (roughness of the surface of the web creates a friction with the substrate positioned on the web). When stress is placed on the web, only a minor portion of this stress, if any, is transferred to the substrate.

The present high throughput system for deposition of thin films on substrates for use in optical disks offers much faster processing times than may be achieved in a cluster tool. Loading and unloading devices in the present thin film deposition system preferably comprise moving webs which are much faster in handling substrates than a central handling arm and transfer chamber as in a cluster tool.

In a preferred embodiment of the present high throughput system, an optical disk substrate (usually two positioned in tandem, transversely across the moving web) is loaded continuously onto a continuously moving roll-to roll web from a loading cassette. System downtime due to roll changes may be minimized by using automatic flying splicers on both the unwind and rewind of the rolling, that is, by using on-the-fly roll changes to maintain a longer continuous operation of the system. The "flying splices" feature fastens the end of the previous supply roll of web material to the forward edge of the succeeding supply roll so as to permit continuous and efficient operation of the overall processing system. The apparatus used to produce flying splices is presently known in the art in the production of metal coated decorative polymeric films. An example for automated splicing where two webs ends are joined together on a turret unwind at speed is described in "Mechanics of Web Handling" by D. R. Roisum, Tappi Press, 1998. Equipment is available from Faustel, Inc., McCormick Drive, Germantown, WI 53022.

The roll-to-roll material is typically a film of a polymeric material such as a polyester (for example, PET); PET is recommended as a material for the continuously moving web because it is relatively inexpensive, and therefore disposable. The surface of the polymeric web material which contacts the optical disk is either electrostatically charged or roughened, or both, to provide for either an electrostatic holding or a frictional holding of the disk in position on the moving web. The web film may be purchased in the desired condition, or an electrostatic charging or plasma roughening device may be installed to provide for on line treatment of the web film either independent from or within the present deposition system. The techniques used to electrostatically charge polymeric films such as polyvinylidene chloride or to roughen film surfaces using plasma treatment are well known in the art.

A cassette of containing multiples of disks of 120 mm (4.7 inch) diameter feeds via a loading platform onto a constantly moving web, which typically moves relatively slowly. For example, for depositing a typical film thickness of 100 nm, the roll speed of a carrier web can be varied from 50 to 150 cm per minute. This provides a throughput as high as about 300 substrates per hour, which is up to ten-fold higher than a current sputter deposition tool which handles substrates one after another in succession. The throughput will be further doubled or tripled if a wider carrier web is employed. For example, when two disks are processed in tandem, transversely across the moving web, so that they move in parallel along the longitudinal direction of travel of the web, the roll width is about 50 cm. In this instance, the overall throughput is 300 substrates per hour, at a roll line-speed of only 20 cm per mm.

Typically, the moving web carries the disks through a series of thin film deposition steps. After formation of a multilayer thin film stack upon the disk substrate, the disks are separated (removed from the surface of) the underlying moving carrier web and transferred via an unloading platform into a receiving cassette. The preferred method for thin film deposition upon the optical disk substrate is either sputtering or reactive sputtering. This film deposition technique is rapid and easier to maintain than several of the other potential thin film deposition processes. The preferred sputtering target is a rectangular-shaped sputtering target (cathode) and a magnetron sputtering source, both of which are known in the semiconductor processing art and are readily available on the commercial market.

Due to a continuous deposition operation carried out over a continuously moving web, there are fewer engineering problems such as hardware reliability and control. For example, the plasma used as the sputtering source is operated continuously rather than on and off, which produces less wear and stress on the sputtering source in general. Benefits from longer equipment lifetime also contributes to a high system uptime.

Sputtering target materials used in the deposition of thin films for optical disk applications are generally of a ceramic nature, due to the required optical properties. Highly dense and pure materials are required for high quality thin film layers. Dense materials tend to produce less free particles and arcing during sputtering. An advantage of using a sputtering deposition process is that highly pure target materials can be used to provide highly pure deposited thin films. Typically the sputtered, dense materials exhibit fewer pinholes and "voids" in the deposited layers in comparison to films deposited using other techniques. The sputtering systems used in current optical disk production equipment require large target sizes than those described for the present invention; the larger target sizes provide poorer yield and high target cost is expected. The smaller targets of the kind which can be used in the system of the present invention are available in higher purity at lower cost. Another advantage of using high quality target materials which provide higher film quality is process integration, in terms of layer-to-layer integrity and lower multi-layer stress, which in turn increases mechanical properties of the product.

The sputtering target assembly is configured at an angle to the horizontal plane of the continuously moving web so that step coverage on the surface of the optical disk substrate, during deposition or a reasonably high temperature target material, is improved over the groove and the land areas. Also the distance is adjustable from the target surface to the surface of the passing substrate passing under the target. The deposition rate of each material is adjusted by changing variables such as the target-to-substrate distance and cathode power while maintaining a pre-determined, nominal carrier web speed.

I. APPARATUS USED TO CARRY OUT THE INVENTION

Figure 1:
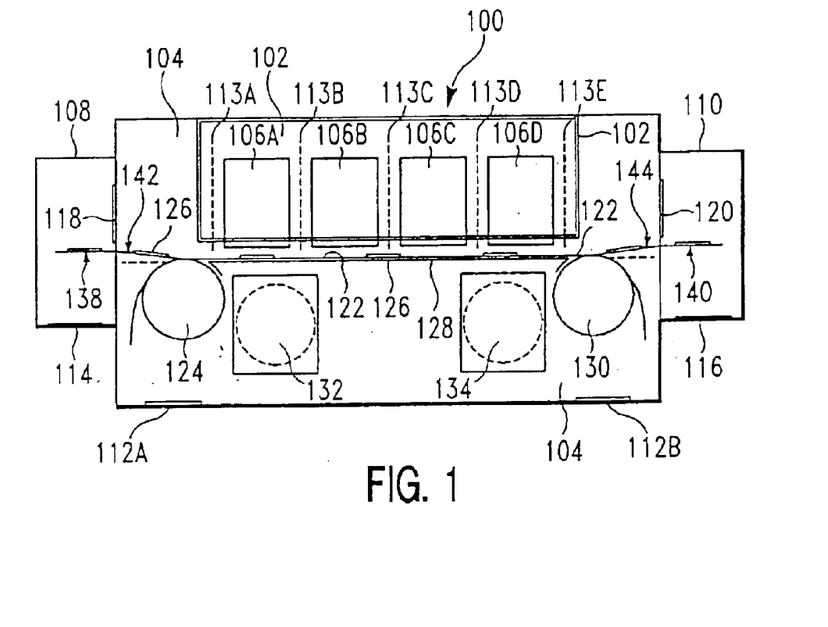
FIG. 1 shows a schematic of a cross-sectional view of a typical high throughput thin film deposition system.

FIG. 1 shows a schematic of a cross-sectional view of a typical high throughput thin film deposition system 100. A cathode assembly enclosure 102 isolates the sputtering cathodes, which are operated at atmospheric pressure, from the central process chamber 104 which is operated at a vacuum typically greater than about $10^{-4}$ torr ($1.3 \times 10^{-2}$ Pa). An individual sputtering cathode assembly 106 is shown in more detail in FIGS. 2A and 2B. The system 100 consists of a central processing chamber 104, loading chamber 108, and unloading chamber 110. Preferably, separate vacuum pumps (not shown) are used for the evacuation of each chamber 104, 108, and 110, through vacuum gate valves 112A and 112B, 114, and 116, respectively. Central processing chamber 104 is isolated from loading chamber 108 and from unloading chamber 110 by vacuum (slit) valves 118 and 120, respectively.

The web material (typically a polymer such as PET) used to form the continuously moving web 122 is fed from a feed roll stand 124 and taken off at a take off roll stand 130. Continuously moving web 122, carrying substrates 126 passes under up a series of film deposition devices 106A, 106B, 106C, and 106D, not by way of limitation in number, while passing over a slightly curved roll drum 128. The roll drum 128 typically consists of many rollers (not shown) and flats (not shown) which are used to provide cooling of the web 122 and substrates 126 when required. Although not shown in the drawing, for purposes of better illustration, the roll drum 128 is in close contact with moving web 122. The tensioning apparatus and speed control apparatus (not shown here) are also applied to the roll drum 128 to provide a pre-determined nominal web tension and rate of travel.

Typically, the longitudinal length of film on a roll used to supply the moving web is about 1,500 meters. As the film on feed roll stand 124A begins to run out, a film splicing process called the "flying splicer" process, previously discussed, may be applied to splice film from a new feed film roll held on second feed roll stand 132. The splicing method is described in U.S. Pat. No. 5,823,461, assigned to Faustel Corporation. During the splicing of the feed roll film, the take-off film is cut going to take-off roll stand 130 and restarted on second take-off roll stand 134, by the automated equipment.

Normal chamber cleaning or other planned maintenance is planned to coincide with sputtering target 32 (shown in FIG. 2) lifetime, film formation requirements, or the changing of feed and take-off roll stands.

Figure 2A:
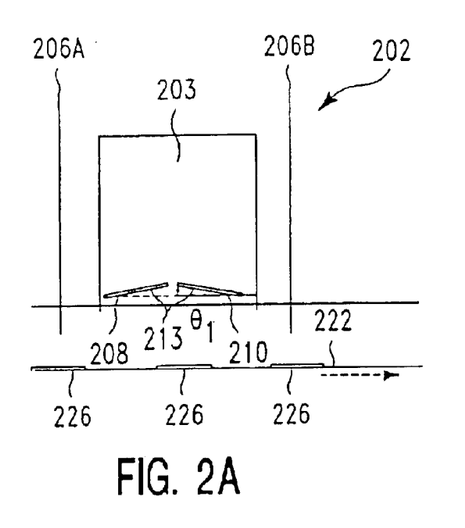
FIG. 2A shows a schematic of a cross-sectional view of a narrow, rectangular shaped magnetron cathode assembly having a longitudinally tilted target, tilted at an angle θ. Also shown are isolation shields which separate one cathode assembly from another.
Figure 2B:
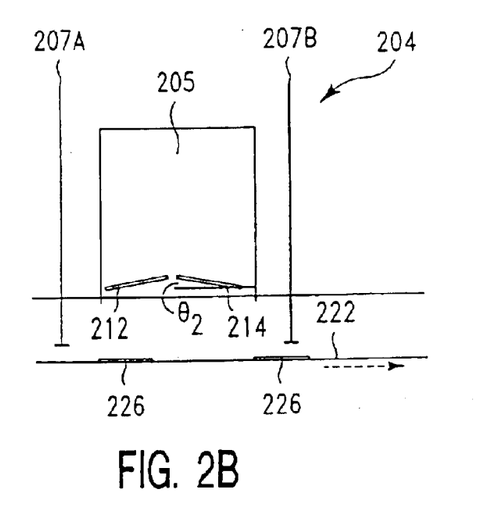
FIG. 2B shows a schematic similar to that of FIG. 2A; however, the isolation shields are "T" shaped at the edge nearest the moving web, to assist in the collection of debris, such as falling or detached particles which might otherwise deposit on a substrate.

Each sputtering cathode assembly, 106A, 106B, 106C, and 106D, is isolated by shields, such as 113A through 113E shown on FIG. 1. The shields are used to reduce or eliminate any cross-contamination between depositing film layers and to prevent particulates from depositing upon adjacent apparatus, and to isolate RF interference between neighboring sputtering targets (cathodes). FIGS. 2A and 2B show two embodiments, 202 and 204 of cathode assemblies 203 and 205 in combination with isolation shields 206A and 206B, and with isolation shields 207A and 207B, respectively. In particular, FIG. 2A shows sputtering cathodes 208 and 210, each tilted at an angle $\theta_1$ with respect to the planar surface of moving web 222 which carries substrates 226. FIG. 2B shows sputtering cathodes 212 and 214, each tilted at an angle $\theta_2$ with respect to the planar surface of moving web 222 which carries substrates 226. The sputtering cathodes need not each be positioned at the same angle $\theta$, but may be positioned to provide the best coverage and desired film layer to be deposited upon substrate 226. Isolation shields 206A and 206B typically extend from the upper area of the cathode assembly 203 to a distance of about 5 mm above the upper surface of substrates 226 which are traveling on moving web 222. Isolation shields 207A and 207B are basically the same as those shown as 206A and 206B, except that they are "T" shaped at the bottom, which is adjacent to traveling web 222. The spacing between the bottom of the "T" and the surface of substrates 226 is typically about. 5 mm. The length of each arm of a "T" is typically up to about 5 mm. As previously mentioned, these "T" arms prevent debris from falling on substrate surfaces.

Figure 3:
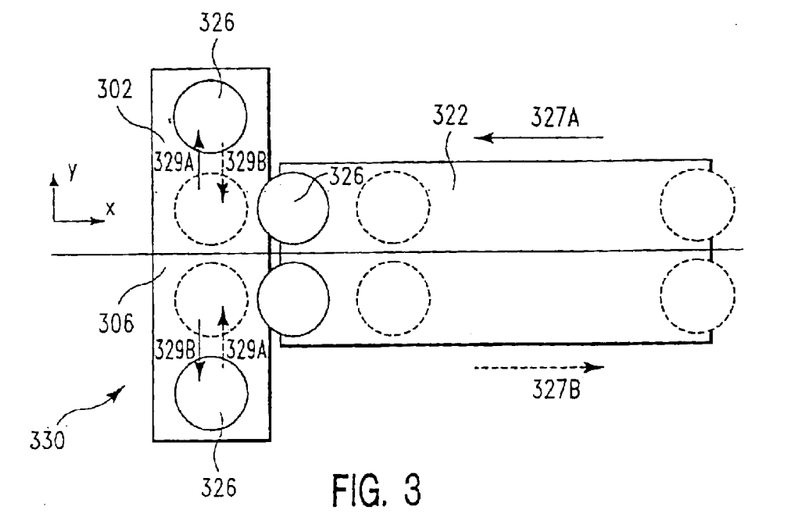
FIG. 3 shows a schematic layout of one embodiment of a substrate loading (or unloading) apparatus. The apparatus includes a loading (or unloading) platform which can move in the -x and -y direction, adjacent the continuously moving web.

A typical thin film deposition system for optical disk applications may contain up to 4 sputtering cathode assemblies 106 to form the desired film compositions for a multilayered product or to obtain optimum throughput for a particularly thick film deposition of a film having a single composition. To obtain good step coverage, a typical sputtering cathode assembly comprises a pair of magnetron targets shown in FIG. 2A as 208 and 210. Preferred power for application to a cathode 208, for example, is RF power, since target materials are typically ceramic. Typically, the cathode 208 is the sputtering target. The target (cathode) is preferably rectangular in shape, to accommodate the width of the continuously moving web 222. Typical dimensions of a cathode target 208 are a 30 cm width (in the direction transverse to the moving web), to accommodate two disk substrates positioned transverse to the moving web, as shown in FIG. 3. To enhance the step coverage, the cathode target 208 surface is adjusted by tilting, so that the angle $\theta_1$ shown in FIG. 2A is usually less than 20 degrees. For optimum and balanced depositions, the distance between the target surface and the substrate is independently adjusted along with individual cathode power optimization. Also, in order to maintain good contact with roll drum 128, (which includes cooling water which flows inside a shell under the roll drum surface to provide heat transfer with respect to moving web 126 as shown in FIG. 1, or moving web 222 as shown in FIG. 2A), the plane of web 222 is generally very slightly concave with respect to horizontal (as is roll drum 128).

FIG. 3 shows how the substrates 326 are being transported over the continuously moving web 322, which is about 50 cm wide to accommodate two substrates 326 positioned transversely across web 322. FIG. 3 also shows an arrangement for loading or unloading of the substrates when two substrates are in motion in parallel. The loading and transfer onto moving web 322 or transfer and unloading off of moving web 322 is made via x- and y-movement on the platform 330 which could be a loading or unloading platform depending on placement in the system and direction of motion. For example platform 330 could be a loading platform 142 of the kind shown in FIG. 1, or a loading platform 302 of the kind shown in FIG. 3, where the x-direction motion is predominantly 327B and the y-direction motion is predominantly 329B. Or, platform 330 could be an unloading platform 144 of the kind shown in FIG. 1, or a loading platform 306 of the kind shown in FIG. 3, where the x-direction motion is predominantly 327A and the y-direction motion is predominantly 329B. The loading platform 142 may be slightly tilted toward the moving web 122 as shown in FIG. 1, and the unloading platform 144 may be slightly tilted away from the moving web 122, as shown in FIG. 1. The tilt is adjusted for timely and reliable transfer toward or away from the continuously moving web 122. To begin processing, each substrate 126 is transferred from loading cassette 138 in loading chamber 108 onto loading platform 142 and from there onto moving web 122. After processing, each substrate 126 is transferred from moving web 122 onto unloading platform 144 and from there to unloading cassette 140 in unloading chamber 110.

Figure 4:
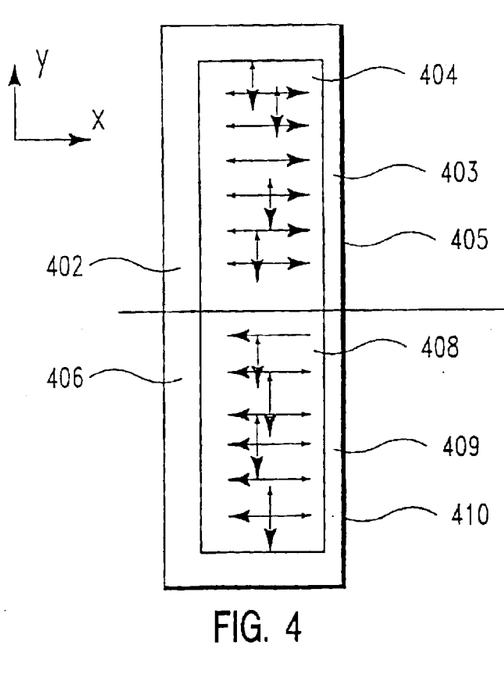
FIG. 4 shows, a more detailed schematic layout of a loading (or unloading) platform for x- and y-direction movement control of substrates being loaded (or unloaded) from the continuously moving web (not shown). The platform includes a table and a moving belt on the surface of the table.

FIG. 4 shows a top view of a loading platform 402 having a moving belt 404 on its upper surface 403. Although moving belt 404 can move back and forth in the x-direction and the y-direction, to better position substrates, the predominant directions of motion are as shown by the larger arrows so that a substrate (not shown) will move onto a moving web (not shown) positioned adjacent edge 405 of loading platform 402. FIG. 4 also shows a top view of an unloading platform 406 having a moving belt 408 on its upper surface 409. Although moving belt 408 can move back and forth in the x-direction and the y-direction, to better position substrates, the predominant directions of motion are as shown by the larger arrow so that a substrate (not shown) will move off of a moving web (not shown) positioned adjacent edge 410 of loading platform 406.

Figure 5:
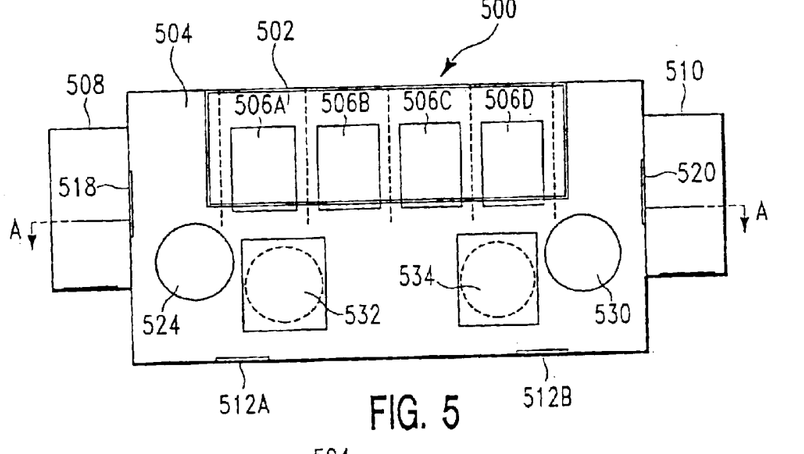
FIG. 5 shows the schematic cross-sectional view of the high throughput thin film deposition system shown in FIG. 1, with an overlying top view 5A—A of the lower portion of the deposition system, which illustrates a first and second web feed roll, a first and second web take off roll present in the central processing chamber, plenum chambers from which substrates enter the system and are taken off from the system, isolation (slit) valves between the central chamber and plenum chambers and side openings in the central chamber which provide access to the feed and take off rolls.

FIG. 5 shows the basic FIG. 1 schematic of a cross-sectional view of a typical high throughput thin film deposition system 500, where some elements of the system have been removed to permit construction of a top view shown in FIG. 5 A—A.

In particular, a cathode assembly enclosure 502 isolates the sputtering cathodes, 506A through 506D from central processing chamber 504. The system 500 consists of a central processing chamber 504, loading chamber 508, and unloading chamber 510. Vacuum gate valves 512A and 512B are attached to a vacuum system which maintains the desired vacuum in central processing chamber 504. Central processing chamber 504 is isolated from loading chamber 508 and from unloading chamber 510 by vacuum (slit) valves 518 and 520, respectively. The web material used to form the continuously moving web (not shown) is fed from a feed roll stand 524 and taken off at a take off roll stand 530. The continuously moving web (not shown) passes under up a series of film deposition devices 506A through 506D, while passing over a slightly curved roll drum (not shown) A second feed roll stand 530 and second take off roll stand 534 are available so that as the film on feed roll stand 524 begins to run out, a film splicing process called the "flying splicer" process, previously discussed, may be applied to splice film from a new feed film roll held on second feed roll stand 532. The collected, expended web film is cut going to take off roll stand 530, and is restarted on second take-off roll stand 534.

FIG. 5 A—A is a top view of the lower portion of the system shown in FIG. 5, and shows more clearly the relationship between central processing chamber 504, loading chamber 508, unloading chamber 510, loading vacuum valve 518, unloading vacuum valve 520, and vacuum gate valves 512A and 512B which are attached to a vacuum system (not shown) which maintains the desired vacuum in central processing chamber 504. In addition, FIG. 5 A—A also clearly shows the relative positions of feed roll stand 524 and second feed roll stand 532, as well as the relative positions of take off roll stand 530 and second take off roll stand 534, with door 513A which provides access to feed roll stands 524 and 532, and door 513B which provides access to take off roll stands 530 and 534.

Figure 6:
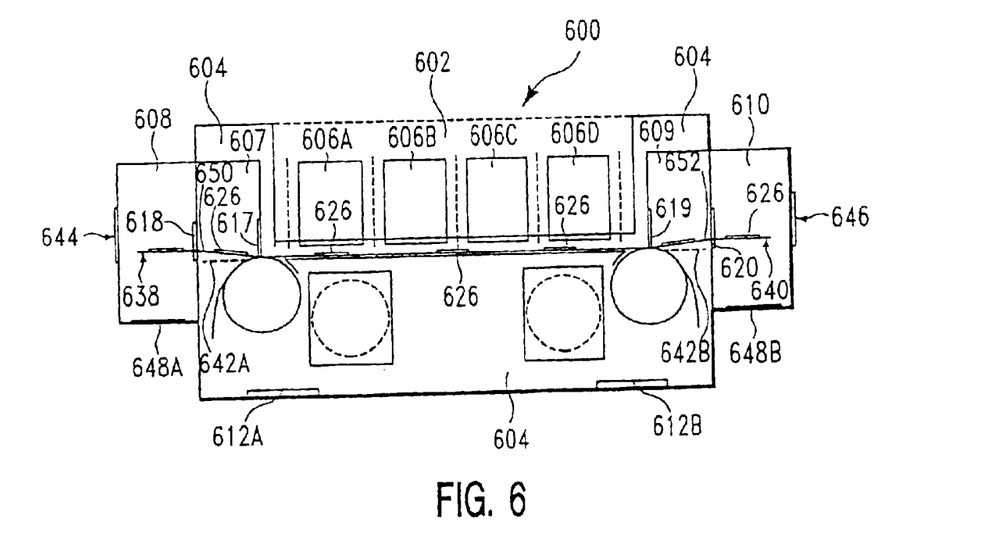
FIG. 6 shows a schematic of another embodiment of a high throughput thin film deposition system, where two plenum loading and unloading chambers are used so that an increased vacuum may be used in the central processing chamber.

In a second embodiment of the invention, shown in FIG. 6, there are two additional features for easy loading and unloading of a substrate 626 between the main and plenum chamber for loading 607 and plenum chamber for unloading 609. In particular, a central processing chamber 604 is maintained under vacuum, usually in the range of about $10^{-6}$ torr ($1.3 \times 10^{-4}$ Pa). The vacuum is maintained by a dedicated vacuum system (not shown) which is attached to vacuum ports 612A and 612B. This chamber is not exposed to air under normal deposition and substrate 626 loading and unloading steps. A plenum chamber for loading 607 is used to transfer a substrate 626 from a loading load-lock 608. Another plenum chamber for unloading 609 is used to transfer a substrate 626 from an unloading load-lock 610. Plenum chambers 607 and 609 are operated under a moderate vacuum, typically in the range of about $10^{-4}$ torr ($1.3 \times 10^{-2}$ Pa), which is pumped down by a second vacuum system (not shown) which is attached to vacuum ports 642A and 642B. Substrates 626 are continuously transferred via vacuum isolation (slit) valves 618 between loading load-lock 608 and plenum chamber for loading 607; 617 between plenum chamber for loading 617 and central processing chamber 604; 619 between central processing chamber 604 and plenum chamber for unloading 609; and 620 between plenum chamber for unloading 609 and unloading load-lock 610. The vacuum isolation valves repeatedly open and close as substrates 626 pas into and out of each chamber. System control software maintains coordination between the opening and closing of the isolation valves so that valves 618 and 617 are not open at the same time, for example, so there will be no exposure of central processing chamber 604 to adverse vacuum conditions, or "vacuum back".

Also shown in FIG. 6 is loading port 644 through which substrate loading cassette 638 is loaded and unloaded; unloading port 646 through which unloading/storage cassette 640 is loaded and unloaded; and vacuum ports 648A and 648B which are attached to a third vacuum system (not shown) which is pumped down by to a vacuum in the range of about $10^{-2}$ torr (1.3 Pa). Loading platform 650 and unloading platform 652 are of the kind described with reference to loading platform 142 and unloading platform 144 of FIG. 1. FIG. 6 also shows a series of deposition devices 606A through 606D.

II. METHOD FOR DEPOSITING THIN FILM LAYERS USING THE APPARATUS OF THE INVENTION

EXAMPLE

For purposes of this example, the optical recording medium comprises 4 layers of deposited thin films. In particular, the first deposited layer is a dielectric layer of $SiO_2$ which is 80 nm thick. The second deposited layer is a recording layer of $Ge_3Sb_3Te_5$ which is 20 nm thick. The third deposited layer is another dielectric layer of $SiO_2$ which is 25 nm thick. The fourth deposited layer is a reflection layer of an aluminum alloy which is 60 nm thick. The first deposited layer is deposited on a substrate which is typically polycarbonate and which is approximately 0.6 mm to about 1.2 mm thick, and which is in the shape of a disk having a diameter of 120 mm (4.7 inches).

With reference to FIG. 1, the polycarbonate substrates are available from a cassette 138 of the kind known in the semiconductor industry for providing substrates. The cassette 138 is positioned in a loading chamber 108. Loading chamber 108 is held under vacuum at a pressure of about $10^{-4}$ torr ($1.3 \times 10^{-2}$ Pa). Individual disk substrates 126 are fed from the cassette 138 through vacuum valve 118 onto a moving platform 142 of the kind shown in FIG. 3A, which is located in central processing chamber 104. Moving platform 142 has a movable surface 404 of the kind shown in FIG. 4, which moves in the -x and -y directions as shown in FIG. 4. The substrates 126 pass from movable platform 142 onto moving web 122 within central processing chamber 104 which is at a pressure of about $10^{-5}$ torr ($1.3 \times 10^{-3}$ Pa).

A series of polycarbonate substrates is loaded onto the continuously moving web 122, which is typically a PET film web moving at a roll speed which commonly ranges from about 50 to about 150 cm per minute. This roll speed is based on the required film thickness of the thin film layer which has the most narrow processing window. Each of the four layers of material to be deposited is sputter deposited. For the roll speed given above, in combination with other process variables provided below, a typical film thickness is about 100 nm. The power to the sputtering target and the spacing between the sputtering target and the substrate is set to provide a desired film thickness at the roll speed of the moving web. The surface of the PET web which contacts the optical disk substrate has been roughened to provide for frictional holding of the substrate in position on the web.

The moving web 121 with substrates 126 in place on its surface passes under isolation shield 113 and under a first thin film deposition sputtering device 106A. The pressure at the surface of substrate 126 is the pressure in central processing chamber 104, which is about, which is under vacuum at a pressure of about $10^{-5}$ torr ($1.3 \times 10^{-3}$ Pa). The sputtering targets in sputtering device 106A are may be silicon when the sputtering plasma is generated from a gas which includes both argon and oxygen, or may be silicon oxide when the plasma is generated from an argon source gas. The sputtering targets are typically about 12 to about 20 cm wide (transverse to the moving web 122) and are up to about 80 cm in length (longitudinal to the moving web), although the targets may be any shape and size which provides advantageous results. Commonly the targets are spaced approximately 3 to 7 cm above the surface of the substrate 126. The sputtering targets are typically tilted, as shown in FIG. 2A, at an angle θ of less than about 2°. The RF power applied to each target cathode is typically about 100 to about 5,000 W at a frequency of about 10 to about 30 MHZ, typically about 13.56 MHZ. The sputtering source is a planar magnetron of the kind available from Leybold Materials, Inc. of Morgan Hill, California. The feed rate of the gas used to create the sputtering plasma is commonly in the range of about 100 sccm or less, depending on the desired deposition rate of the sputtered material. The temperature of a polycarbonate substrate 126 upon which sputtering deposition is made is typically limited to about 100° C. or less when the moving web is PET. However, the substrate temperature may be higher when the web is formed of a material which can withstand higher temperatures. A $SiO_2$ film having a thickness of about 80 nm is formed on the upper surface of polycarbonate substrate 126.

The moving web 122 with substrates 126 in place on its surface then passes under isolation shield 113B and under a second thin film deposition sputter device 106B. The sputtering cathodes in sputter chamber 106B are $Ge_3Sb_3Te_5$ The sputtering cathodes are approximately the same size as described with reference to the silicon or silicon dioxide sputtering targets, and are spaced from the substrate surface and tilted in a similar manner. The RE power applied to each ranging from about 10 MHZ to about 30 MHZ. The sputtering source is a planar magnetron of the kind previously described, and the gas used to create the sputtering plasma is typically argon which is fed into sputter chamber 106B at a feed rate ranging from about 5 to about 200 sccm. The argon gas may be combined with oxygen and/or nitrogen, where argon is about 80 volumetric % or more of the mixture. A 20 nm thick thin film of $Ge_3Sb_3Te_5$ recording medium is formed over the surface of the first thin film layer of $SiO_2$ on the upper surface of substrate 126, which is at a temperature of about 100° C. or less during deposition of the $Ge_3Sb_3Te_5$ film.

The moving web122 with substrate 126 in place on its surface then passes under isolation shield 113C and under the third thin film sputter deposition device 106C. Again, the substrate is in central processing chamber 104 which is at a pressure of about $10^{-5}$ torr ($1.3 \times 10^{-3}$ Pa). The sputtering cathodes in sputter chamber 106C are aluminum or aluminum alloy (such as aluminum-copper or aluminum-titanium, or other conductive alloy known in the art) and are approximately the same size as described with respect to the silicon or silicon oxide sputtering targets. Sputtering target tilt relative to and spacing from the upper surface of substrate 126 is as previously described. The RF power applied to each sputtering cathode is about ranging from about 10 MHZ to about 30 MHZ. The sputtering source is a planar magnetron of the kind previously described, and the gas used to create the sputtering plasma is typically argon which is fed into sputter chamber 106B at a feed rate ranging from about 5 to about 200 sccm. A 60 nm thick thin film, of aluminum or other conductive alloy is formed over the surface of the second thin film layer of $Ge_3Sb_3Te_5$ on the upper surface of substrate 126, which is typically at a temperature of about 100° C. or less during deposition of the aluminum film.

The moving web 122 with substrate 126 in place on its surface then passes under isolation shield 113E, and substrates 126 is transferred from moving web 122 onto the unloading platform 144, which is located within central processing chamber 104, as shown in FIG. 1. The substrate 126 then passes through a vacuum valve 120, to enter unloading chamber 110 and into unloading cassette 140.

When the substrates (typically two in tandem) are to be loaded onto moving web 122 from loading platform 142 or from unloading platform 144 into storage and handling cassette 140, it may be desirable to use an additional stroke in the x-direction of the moving platform 142 or 144 to assist in the transfer. This additional stroke is referred to as a "push off".

The method described above for the deposition of multiple layers of thin films on an optical disk substrate provides significant advantages in particulate reduction, due to the uniformity of sputtering target erosion and the avoidance of constant power on- and off-cycles as are required for single substrate processing systems. When the plasma power to the sputtering target goes through on- and off-cycles, this causes thermal cycling of the target and the resulting expansion and contraction results in "spalling off" of adhered materials in a rather random interval. In the current design, with a continuous deposition mode, this source of contaminating particulate production is eliminated. Further, the use of a disposable polymeric web material such as PET eliminates the support surface underlying the substrate as a source of particles. In the case of batch in-line systems, the underlying surface becomes contaminated and is used over and over again. In addition a substrate "clamp" or holder used to hold the substrate in position in such systems is also a source for particulate accumulation and generation.

Particulate generation also occurs in cluster or in-line systems as a result of the required sputtering target size and shape. When the target size increases the target manufactures have difficulty in maintaining purity of the target. Defects in the target lead to particulates in a form of "splash" on the deposited film. The present deposition apparatus permits use of a narrow and long target configuration, which is lower in cost and makes production of a high purity target easier.

The above described preferred embodiments are not intended to limit the scope of the present invention, as one skilled in the art can, in view of the present disclosure, expand such embodiments to correspond with the subject matter of the invention claimed below.

I claim:

1. An apparatus for depositing at least one thin film on a substrate useful in electronic applications, the apparatus comprising:
    (a) an in-line continuously moving web for simultaneously transporting a number of substrates to which a thin film of material is to be applied, wherein said moving web is a roll-to-roll moving disposable web consisting essentially of a polymeric material and wherein said substrates are held to said web by friction against or electrostatic attraction to a web surface;
    (b) a central processing chamber which is maintained under vacuum and through which at least a portion of said continuously moving web travels;
    (c) at least one deposition device which is located within said central processing chamber, where at least a portion of said continuously moving web is exposed to material deposited from said deposition device;
    (d) a first moving platform which moves in an x direction and a y direction, which transfers a substrate onto said continuously moving web; and
    (e) a second moving platform which moves in an x direction and a y direction, which transfers a substrate from said continuously moving web.

2. The apparatus of claim 1, wherein at least one deposition device is a sputtering device.

3. The apparatus of claim 1, wherein a device is present which permits web splicing during continuous operation of said apparatus.

4. The apparatus of claim 1, wherein said polymeric material is PET.

5. The apparatus of claim 2, wherein a power applied to a cathode in said sputtering device is RF power.

6. The apparatus of claim 5, wherein said cathode is a sputtering target.

7. The apparatus of claim 6, wherein a sputtering target used in said sputtering device is rectangular in shape.

8. The apparatus of claim 6, wherein said sputtering target is comprised of a ceramic or metal.

9. The apparatus of claim 8, wherein said sputtering target is comprised of a material having optical transmission properties useful in optical applications.

10. The apparatus of claim 2, wherein said sputtering device includes a planar magnetron.

11. The apparatus of claim 1, wherein at least one isolating shield is used to separate one thin film deposition area from another thin film deposition area.

12. The apparatus of claim 1, wherein at least said first or said second moving platform is located within a plenum chamber which is at a pressure which is different from the pressure in said central processing chamber.

13. The apparatus of claim 1, wherein said central processing chamber is maintained at a base vacuum of at least $10^{-5}$ Torr ($1.3 \times 10^{-3}$ Pa).

14. The apparatus of claim 1, wherein said apparatus also includes a cooling surface which permits the cooling of said continuously moving disposable web within said central processing chamber.

15. The apparatus of claim 1, wherein said disposable web material is polyvinylidine chloride.

* * * * *